(12) United States Patent
Ruggeri et al.

(10) Patent No.: US 7,737,608 B2
(45) Date of Patent: Jun. 15, 2010

(54) ENHANCED AMPLITUDE PIEZOELECTRIC MOTOR APPARATUS AND METHOD

(75) Inventors: Robert T Ruggeri, Kirkland, WA (US); Dan J Clingman, Auburn, WA (US)

(73) Assignee: The Boeing Company, Chicago, IL (US)

( * ) Notice: Subject to any disclaimer, the term of this patent is extended or adjusted under 35 U.S.C. 154(b) by 185 days.

(21) Appl. No.: 11/434,427

(22) Filed: May 15, 2006

(65) Prior Publication Data

US 2006/0202592 A1 Sep. 14, 2006

Related U.S. Application Data

(63) Continuation-in-part of application No. 11/344,823, filed on Feb. 1, 2006, now Pat. No. 7,521,841, which is a continuation of application No. PCT/US2004/025049, filed on Jul. 30, 2004.

(60) Provisional application No. 60/491,122, filed on Jul. 30, 2003.

(51) Int. Cl.
*H01L 41/04* (2006.01)
*H01L 41/09* (2006.01)

(52) U.S. Cl. .................. 310/339; 310/328; 310/330; 310/332

(58) Field of Classification Search ......... 310/328–332, 310/339, 345, 355
See application file for complete search history.

(56) References Cited

U.S. PATENT DOCUMENTS 3,315,103 A * 4/1967 Duff et al. ................ 310/328

| | | | |
|---|---|---|---|
| 4,598,587 A * | 7/1986 | Dwyer et al. ............ 73/514.13 |
| 6,236,143 B1 | 5/2001 | Lesieutre et al. |
| 6,747,573 B1 | 6/2004 | Gerlach et al. |

(Continued)

FOREIGN PATENT DOCUMENTS

DE 10103952 10/2002

(Continued)

OTHER PUBLICATIONS

Post-Buckled Precompressed (PBP) Actuators:Enhancing VTOL Autonomous High Speed MAVs by Ron Barrett; 46th AIAA/ASME/ASCE/AHS/ASC Structures, Structural Dynamics & Materials Conference Apr. 18-21, 2005, Austin, Texas.

(Continued)

*Primary Examiner*—Walter Benson
*Assistant Examiner*—Derek J Rosenau
(74) *Attorney, Agent, or Firm*—Harness, Dickey & Pierce, P.L.C.

(57) ABSTRACT

A piezoelectric drive motor especially well adapted for use with flow control systems on commercial aircraft, military aircraft and spacecraft. In one embodiment, the apparatus includes a support structure that supports a piezoelectric beam. A biasing element, for example a coil spring, is coupled between a free end of the piezoelectric beam and the support structure. The spring exerts a compressive force on the beam and serves to amplify its displacement when electric signals applied to piezoelectric layers on the beam cause deflection of the beam between two stable positions. The drive motor operates over a wider band of drive frequencies than conventional piezoelectric beams and is also suitable for use as a sensor and in a wide variety of actuator applications.

10 Claims, 8 Drawing Sheets

U.S. PATENT DOCUMENTS 6,847,155 B2 * 1/2005 Schwartz et al. ............ 310/328
7,005,778 B2 2/2006 Pistor

FOREIGN PATENT DOCUMENTS

| JP | 2000233157 | 8/2000 |
|---|---|---|
| WO | WO9836395 | 8/1998 |
| WO | WO 02/086981 | 10/2002 |

OTHER PUBLICATIONS

Active Structures Using Buckling Beam Actuators by Eric M. Mockensturm; Jie Jiang; 44th AIAA/ASME/ASCE/AHS Structures, Structural Dynamics, and Materials Conference;Apr. 7-10, 2003, Norfolk, Virginia.

Improvement of actuation displacement of LIPCA implementing bifurcation phenomena by Quoc Viet Nguyen, Seungsik Lee, Hoon Cheol Park; Smart Structures and Materials 2006; Active Materials: Behavior and Mechanics, edited by William D. Armstrong, Proc. of SPIE vol. 6170, 6170L, (2006).

"Can a Coupling Coefficient of a Piezoelectric Device Be Higher Than Those of Its Active Material?" by George A. Lesieutre and Christopher L. Davis; reprinted from Journal of Intelligent Material Systems and Structures, vol. 8—Oct. 1997.

A Centrally-Clamped Parallel-Beam Bistable MEMS Mechanism by Jin Qiu, Jeffrey H. Lang, Alexander H. Slocum; 0-7803-5998-4/1/$10.00@2001IEEE.

A Curved-Beam Bistable Mechanism by Jin Qiu, Jeffrey H. Lang, Alexander H. Slocum; 1057-7157/04$20.00 copyright 2004IEEE.

* cited by examiner

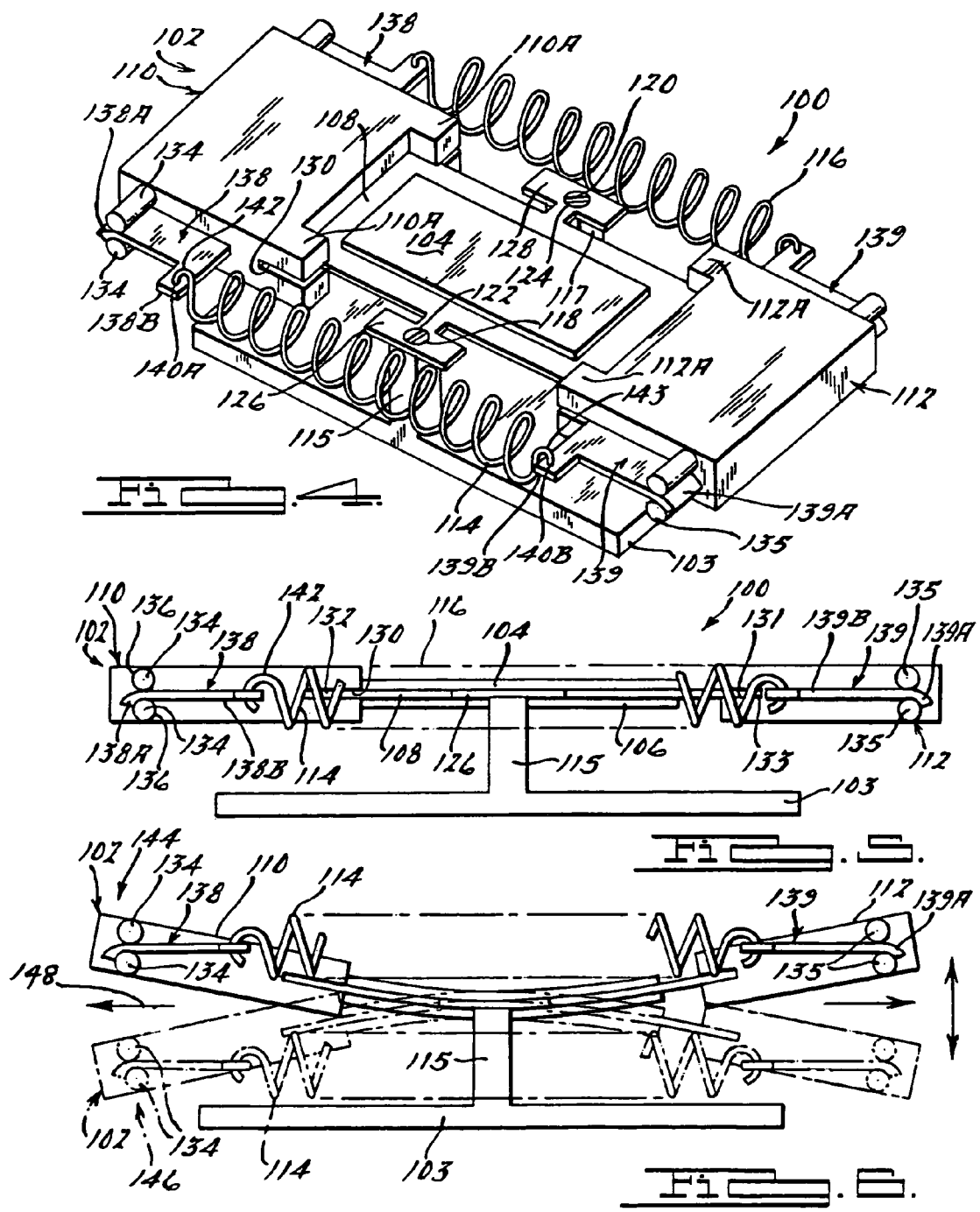

ENHANCED AMPLITUDE PIEZOELECTRIC MOTOR APPARATUS AND METHOD

CROSS-REFERENCE TO RELATED APPLICATIONS

This application is a continuation-in-part of U.S. Ser. No. 11/344,823, filed Feb. 1, 2006, which is a continuation of International Patent Application Serial No. PCT/U.S./2004/025049 filed Jul. 30, 2004, which in turn claims priority from U.S. Provisional Patent Application No. 60/491,122 filed Jul. 30, 2003, the disclosures of which are incorporated herein by reference.

FIELD OF THE INVENTION

The system and method relates to piezoelectric devices, and more particularly to vibration energy harvesting devices and piezoelectric driving devices.

BACKGROUND OF THE INVENTION

Many environments are rich in vibration energy that is ideal for powering machinery or electronics. Such environments often exist in aircraft and automotive applications where the vibration experienced by an aircraft or automotive vehicle represents energy that could be used to power sensors or other remotely located devices, provided such energy can be harvested by a suitable device.

Vibration energy harvesting (VEH) can be accomplished by developing relative motion, and hence energy, between a vibrating structure and a reaction mass coupled to the structure. This mechanical energy can be converted into electrical energy by developing cyclic stress in a piezo electric structure. A simple form of this device is a cantilever beam that has piezo material attached to the surface. This is illustrated in FIG. 1. A reaction mass is attached to the tip of the beam to increase performance. When subjected to vibration, the tip of the beam tends to resist motion, thus placing the piezo material under stress. This stress results in electrical charge accumulation in the piezo material that results in an increase in voltage potential between two points of the material. However, for this topology to work efficiently, vibration energy must occur at or above the beam resonance frequency. Vibration energy with frequency content below the resonance frequency will produce very little motion between the tip mass and the base.

When the cantilever beam shown in FIG. 1 is used, the stiffness of the beam, including the piezo material, beam length (L) and the tip mass determine the lowest frequency where the VEH device will work. Additionally, piezo material is usually a ceramic and is fragile when subjected to tension loading which will limit the robustness of the VEH device and its life. FIG. 2 illustrates the relative tip displacement as a function of frequency for this device. At low frequency, the tip beam moves very little relative to the vibrating structure. Accordingly, the VEH device shown in FIG. 1, at low frequency, will provide very little power from low frequency vibrations. Vibration energy at resonance frequency will provide maximum VEH, but utility is limited by a very narrow bandwidth.

The limitation of needing to "tune" the system around the resonant frequency of the cantilever beam imposes a significant limitation in terms of efficient operation of the system shown in FIG. 1. This is because various structures often produce vibration energy over a much wider frequency bandwidth than what the system can be tuned for. The selection of the tip mass, to essentially tune the system to operate efficiently at the resonant beam frequency, means that the system will not be efficient in harvesting energy at other frequencies above and below the resonant frequency of the cantilever beam. Accordingly, a system that is not limited to efficient harvesting of vibration energy at only the resonant beam frequency, but that is able to harvest energy over a relatively wide frequency range, would be much more effective in generating electrical power from a vibrating structure.

Accordingly, there still exists a need for an apparatus able to be used with a piezo material to improve the harvesting of vibration energy at low frequencies, and also at frequencies above and below the resonant frequency of the structure from which vibration energy is being harvested. Such an apparatus would be extremely useful for powering remotely located sensors and various other components from low frequency vibration energy produced by wheeled vehicles, boats, ships, and aircraft. Such an apparatus would effectively make it possible to provide energy harvesting from a wide variety of structures experiencing low frequency vibration where such energy harvesting would have previously not been practicable.

Still another application for piezoelectric devices is in connection with active flow control on mobile platforms such as high speed jet aircraft. Active flow control is an emerging technology that can increase aircraft performance by manipulating airflow inside the viscous boundary layer at specific points on the aircraft, for example, at specific areas on the wings. This can increase the lift and reduce the drag of aerodynamic bodies such as wings, fuselages, cowlings, struts, flaps and tails. Proper application of active flow control can increase the fuel economy, increase the payload and reduce the operating costs of a wide variety of aircraft, both commercial and military.

All forms of active flow control require some form of actuator or motor to energize a flow control element, to thus modify or change the airflow within the viscous boundary layer. Many forms of actuation have been investigated, but all have been generally sufficiently massive and weight-laden that they negate many, or sometimes all, of the benefit of using active flow control technology.

Accordingly, there still exists a need for a system and method which can provide an extremely lightweight driving implement, for example, a lightweight motor, that can be used to make feasible a large variety of active flow control applications that have been heretofore impractical to implement with existing actuators.

SUMMARY OF THE INVENTION

The present system and method is directed to a piezoelectric device that is well suited for use as an actuator, motor or other form of drive implement. In one form the system comprises a piezoelectric motor which is well suited for use in active flow control applications to control flow control elements such as movable flaps and other flow altering components.

In one embodiment, the apparatus includes a support structure that a flexible beam is supported from. The beam is secured at one of its ends to the support structure. A biasing element is operably associated with the free end of the beam and the support structure to exert a compressive force on the beam.

The beam includes at least one piezoelectric layer of material on one of its surfaces, and in one embodiment at least one layer of piezoelectric material on each opposing surface of the beam. As will be appreciated by those skilled in the art, the piezoelectric material causes flexure of the beam as voltages of different polarities are applied to the piezoelectric layers.

A particular advantage of the apparatus is that the amplitude (i.e., displacement) of the beam is significantly increased without requiring additional drive power or substantially increasing the mass of the beam. This is especially so at frequencies below the natural (i.e., resonant) frequency of the beam.

In operation, the beam and the biasing element are positioned such that the biasing element is able to exert an over center, compressive biasing force on the beam, which effectively "softens" the piezoelectric layer (or layers) on the beam. The beam has two stable positions, one each on opposite sides of a line bisecting the fixed end of the beam and the point where the biasing element is supported from the support structure. Applying a voltage of one polarity causes the beam to flex in a first direction towards one of first and second stable positions. The compressive biasing force provided by the biasing element assists this movement and helps to deflect the free end (i.e., tip end) of the beam fully into the first stable position as the beam leaves its second stable position. Changing the polarity causes the piezoelectric layers to deflect the beam from its first stable position back into its second stable position. The beam can be made to vibrate from one stable position to the other by alternating the direction of the applied voltage. The amplitude excursion of the free end (i.e., tip) of the beam is greater than that which would occur if the biasing element was not employed. The frequency response of the apparatus is also significantly broader than that of a beam of a similar size and weight which does not make use of the biasing element at applied frequencies below the resonant frequency.

When a linkage is coupled to the free end of the beam, the deflection of the free end of the beam and/or its oscillation can be used to control a flap or other form of flow control implement either directly or through a suitable intermediate linkage assembly. The apparatus can thus be used to form a driving implement for a fan, a pump or any other form of fluid moving load device. With a suitable intermediate linkage assembly, the apparatus can also be made to drive a rotary motion implement.

In alternative embodiments, the beam is formed in a recurve configuration and is supported from the support structure at both of its opposing ends by biasing elements. The biasing elements apply a compressive load to the recurve beam, and applying voltages of differential potential to the piezoelectric layer, or layers, on the recurve beam causes the beam to be deflected between two stable positions.

Further areas of applicability of the present system and method will become apparent from the detailed description provided hereinafter. It should be understood that the detailed description and specific examples are intended for purposes of illustration only and are not intended to limit the scope of the present disclosure.

BRIEF DESCRIPTION OF THE DRAWINGS

The present invention will become more fully understood from the detailed description and the accompanying drawings, wherein:

FIG. 4 is a perspective view of an alternative preferred embodiment of the present invention, making use of a pair of apparent biasing elements to soften the piezoelectric flexure of the assembly; and FIG. 5 is a side view of the assembly of FIG. 4;

FIG. 6 is a side view of the assembly of FIG. 4 illustrating the two stable positions;

DETAILED DESCRIPTION OF THE PREFERRED EMBODIMENTS

The following description of the various embodiment(s) is merely exemplary in nature and is in no way intended to limit the present disclosure or its application.

Figure 3:
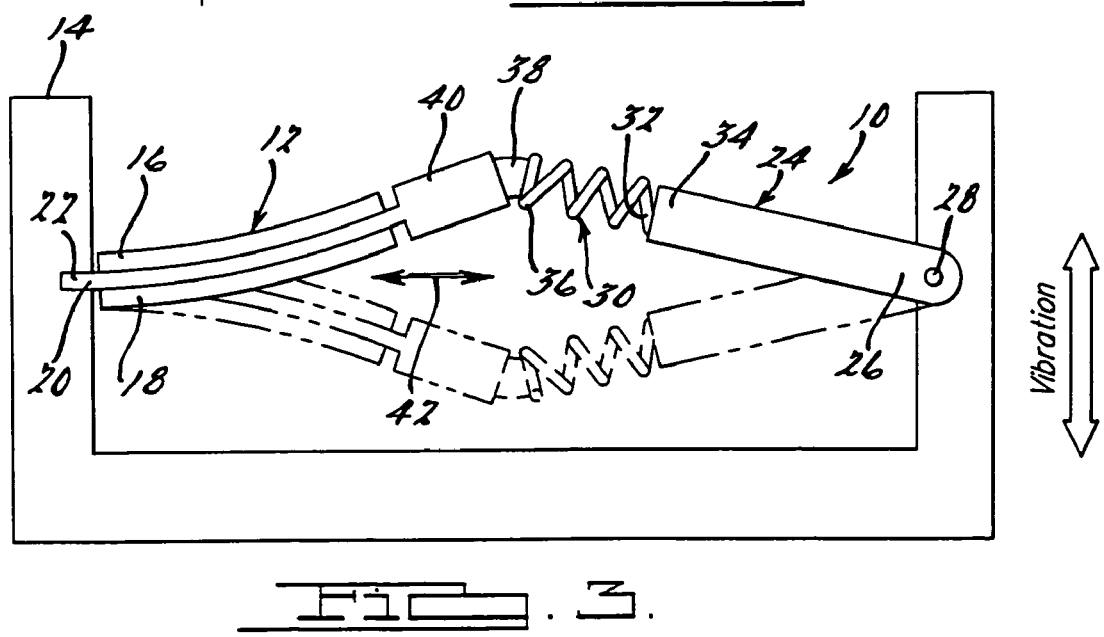
FIG. 3 is a view of a preferred embodiment of the present invention incorporated for use with a composite beam piezo flexure.

Referring to FIG. 3, an apparatus 10 in accordance with a preferred embodiment of the present invention is shown. The apparatus is used for enabling low frequency vibration energy harvesting (VEH) through the use of a piezo flexure 12 which is supported fixedly from a vibrating structure 14. The piezo flexure essentially forms a beam-like structure, and in one preferred form comprises a piezo bimorph flexure. The piezo flexure 12 includes piezo electric layers 16 and 18 formed on opposite sides of a flexible supporting substrate 20. The substrate 20 includes an end 22 which is fixedly coupled to the structure 14. The substrate 20 can be plastic, metal or any other flexible material that allows the piezo electric layers 16 and 18 to be bonded thereto. In lieu of piezoelectric layers, magnetostrictive or electrostrictive materials may also be employed.

The apparatus 10 further includes a link or cantilever beam 24 which is pivotally coupled at a first end 26 via a pivot pin 28 or other suitable coupling element such that the beam 24 is able to pivot about pin 28 in response to vibration experienced by the structure 14. A biasing element 30 is fixedly coupled at one end 32 to a free end 34 of the beam 24 and at an opposite end 36 to a flexure 38. The flexure 38 is in turn coupled to a free end 40 of the piezo flexure 12. Flexure 38 may comprise any suitable coupling element or material which enables relative movement between the end 36 of the biasing element 30 and the free end 40 of the piezo flexure 12. In one preferred form the biasing element 30 comprises a compression coil spring, but it will be appreciated that any biasing element capable of providing a force directed against the piezo flexure 12 could be incorporated.

The coupling of the cantilever beam 24 to the free end 40 of the piezo flexure 12 (via the biasing element 30) produces an arrangement wherein the piezo flexure 12 has two stable positions, with one being shown in solid lines in FIG. 3 and the other being indicated in phantom. Each of the stable positions of the piezo flexure 12 are laterally offset from a longitudinal mid line 42 extending between the point of attachment of the fixed end 22 of the piezo flexure 12 and the pivot pin 28 supporting the cantilever beam 24. The mid-line 42 can be viewed as a position of equilibrium, albeit an unstable one. This geometry essentially produces a geometric cotangent function between the piezo flexure 12 and the biasing element 30. In effect, the piezo flexure 12 experiences a spring constant that is the negative of the spring constant provided by biasing element 30.

The apparatus 10 significantly reduces the force required to move the piezo flexure 12 between the two stable positions shown in FIG. 3. Put differently, the biasing element 30 and cantilever beam 24 operate to significantly "soften" the piezo layers 16 and 18 to overcome the inherent structural stiffness of each. By tailoring the spring constants of the biasing element 30 and the piezo flexure 12, the energy required to switch conditions and cause movement of the piezo flexure 12 out of one stable position and into the other stable position can be matched to the electrical load which the piezo flexure 12 is electrically coupled to. When properly matched, the apparatus 10 is highly efficient. Under such a condition, the energy delivered to the electrical load is equal to the stress-strain hysteresis observed in the piezo flexure 12.

Figure 1:
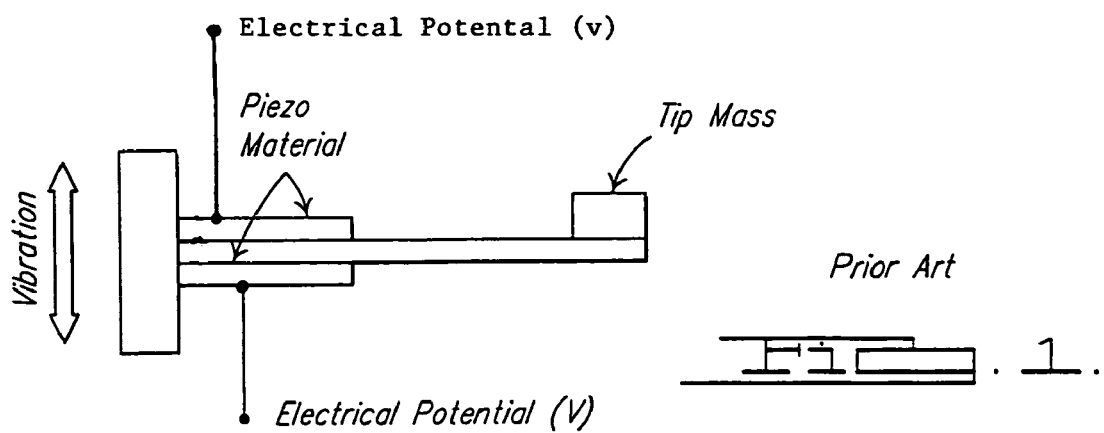
FIG. 1 is a view of a prior art energy harvesting device incorporating a conventional tip mass disposed at a free end of a composite beam-like structure with piezoelectric layers.
Figure 2:
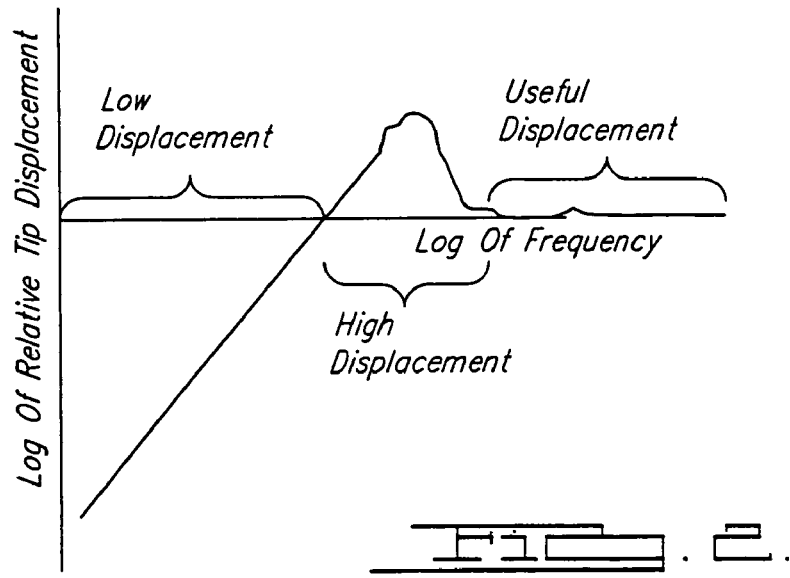
FIG. 2 is a graph of the tip displacement of the beam shown in FIG. 1 relative to frequency.

The apparatus 10 has a significantly lower frequency of operation than a conventional energy harvesting device, such as that shown in FIG. 1. The frequency of operation of the apparatus 10 is determined in part by the stiffness of the piezo flexure 12 and the mass of the piezo flexure. The relationship between the angular tip deflection (i.e., of tip 38) of the piezo flexure 12 and an applied torque is given by equation 1 below:

$$T_{PiezoFlexure} = \theta_{PiezoFlexure} * K_{PiezoFlexure} \qquad \text{Equation 1}$$

The biasing element 30 (i.e., compression spring) applies a non-linear torque to the piezo flexure 12 which is represented by equation 2 below:

$$T_{PiezoFlexure/Spring} = L * F_{Spring} * \sin(\theta_{PiezoFlexure}), \qquad \text{Equation 2}$$

where "L" represents the length of piezo flexure 12 and "F" represents the force provided by the spring.

The torque applied to the piezo flexure 12 deforms the piezo flexure 12 to an angle whereat the piezo flexure 12 is stable at two locations as shown in FIG. 3. The torque required to change the state of the piezo flexure 12 from $+\theta$ to $-\theta$ is the difference between the torque generated by the biasing element in equation 1 and the torque given in equation 2, and is represented by the following Equation 3:

$$T_{Tot} = T_{PiezoFlexure} - T_{PiezoFlexure/Spring} = \theta_{PiezoFlexure} * K_{PiezoFlexure} - L * \sin(\theta_{PiezoFlexure})(F_{max} - 2*L*(1-\cos(\theta_{PiezoFlexure})) * K_{spring})$$

The difference in torque is the effective "softening" of the piezo flexure 12. Equation 4 represents the deflection of the biasing element 30 (i.e., the spring) as a function of piezo flexure angle $\theta$:

$$\delta_{spring} = 2*L(1-\cos(\theta_{PiezoFlexure})) \qquad \text{Equation 4}$$

Equation 5 defines the maximum spring force $F_{max}$:

$$F_{max} = [F_{spring}] = 0 \; \theta$$

Also, a compression spring exhibits a force-distance relationship expressed by equation 6:

$$F_{spring} = -K_{spring} * \delta_{spring} + F_{max}$$

This relationship, when applied to the apparatus 10, results in two stable angles. The torque necessary to change the positions is a strong function of the spring constant, where a softer spring produces a lower reset force (i.e., a force required to move the piezo flexure 12 from one stable position to the other). Equation 3, above, clearly shows the non-linear nature of the torque versus $\theta$ relationship.

An additional advantage of the apparatus 10 is that the two stable positions produce a frequency conversion between low frequency vibration and the high frequency nature of the stable angle locations, or not, depending on the spring stiffness, which is under the control of the designer. Put differently, once external vibration energy has caused the piezo flexure 12 to move from one stable position to the other, the piezo flexure 12 will oscillate around the stable location that it has just moved to, allowing the piezo material 16 and 18 of the piezo flexure 12 to harvest the strain energy over many cycles.

While the apparatus 10 has been described in connection with "softening" a piezo flexure for vibration energy harvesting applications, it will also be appreciated that the apparatus 10 can be readily incorporated in an actuator. For example, the apparatus 10 is extremely well suited to applications requiring large deflections of the piezo flexure and low force, such as with an aerodynamic flow control synthetic jet actuator or a low frequency audio speaker. In this embodiment the apparatus 10 is designed such that the torque required to change the state of the apparatus 10 is within the capability of the piezo material to provide torque. Applying a voltage to the piezo materials 16 and 18 on the piezo flexure 12 causes the apparatus 10 to change states producing significantly larger displacements than would occur if the piezo flexure was energized without the biasing element 30. Typical increases in motion of the piezo flexure 12 with the present invention can be ten to twenty times that obtained with a simple, conventional piezo flexure unassisted by any spring force.

It will also be appreciated that for both energy harvesting and actuation applications, the use of other materials besides piezo electric materials is possible. For example, electromagnetic, electrostatic, electrostrictive and magnostrictive transduction technology can be used.

Referring to FIGS. 4 and 5, a VEH apparatus 100 is illustrated in accordance with another preferred embodiment of the present invention. VEH apparatus 100 generally comprises a piezo flexure assembly 102 supported on a base 103. The flexure assembly 102 includes a pair of piezoelectric wafers 104 and 106 disposed on opposite sides of a support substrate 108. In one preferred form the piezoelectric wafers 104, 106 each comprise piezoceramic wafers. The flexure assembly 102 further includes a pair of link arms 110 and 112 and a pair of biasing elements 114 and 116 coupled between the link arms 110, 112.

The entire flexure assembly 102 is supported on the base 103 from a pair of upstanding boss portions 115 and 117. Conventional threaded fasteners 118 and 120 extend through openings 122 and 124 in support arms 126 and 128 of the support substrate 108 to thus suspend the entire flexure assembly 102 above the base 103. The support arms 126 and 128 are located at an approximate midpoint of the support substrate 108, but the support arms could also be offset so as to be closer to one or the other of the link arms 110, 112 and thus not disposed at the approximate longitudinal midpoint. The substrate 108 can be made of spring steel, beryllium copper, brass, glass epoxy composite or graphite epoxy composite, or any other suitable material.

With specific reference to FIG. 5, the attachment of the biasing element 114 to each link arm 110 and 112 can be seen in greater detail. The same arrangement is used to couple the opposite ends of biasing element 116 to the link arms 110 and 112. Each link arm 110 and 112 includes a slot 130, 131 formed along a portion of its length. Each slot 130, 131 is further disposed along a midpoint of the overall thickness of its respective link arm 110 or 112. Slot 130 has a height sufficient to receive an end 132 of the support substrate 108 therein. Slot 131 similarly is sized to receive end 133 of the support substrate 108. Ends 132 and 133 are each adhered or otherwise secured in their respective slots 130 or 131 such that they are not removable from either link arm 110 or 112.

The link arm 110 further includes a pair of pins 134 that extend through spaced apart openings 136 in the link arm 110. Link arm 112 similarly includes a pair of pins 135 that extend through openings 137 in link arm 112. The pins 134 essentially form a channel through which one end 138A of a flexure component 138 can be secured. Pins 135 similarly form a channel for securing an end 139A of a second flexure component 139. End 138A of the flexure component has a cross-sectional thickness that is greater than an end 138B so that end 138A cannot simply be pulled out from between the pins 134. End 139A of flexure component 139 is constructed in identical fashion with a thickness greater than end 139B so that it cannot be removed from between pins 135. However, this coupling arrangement allows free pivoting movement of ends 138A and 139A about their respective pins 134 and 135 with a minimal degree of friction and while limiting stress at this area of its associated flexure component 138 or 139.

Referring further to FIGS. 4 and 5, each end 138B, 139B of the flexure components 138 and 139 include an opening 140A, 140B which receives an end 142, 143 of the biasing element 114. In practice, any suitable means for attaching the ends 142, 143 of biasing element 114 can be employed. Biasing element 116 is coupled in the same fashion. The link arms 110 and 112 may be made from a variety of materials but preferably are comprised of aluminum, steel, glass or graphite epoxy. Biasing element 114 is illustrated as a coil spring, but in practice any form of spring that is coupled between the link arms 110 and 112 that serves to place the piezoelectric wafers 104 and 106 in compression may be employed.

With further specific reference to FIG. 4, link arm 110 includes a notch forming ears 110A, while link arm 112 similarly includes a notch forming ears 112A. The ears 110A and 112A provide stress transition regions that maintain stiffness across those areas where the opposite ends of the support substrate 108 are coupled to their respective link arms 110, 112. The gap formed between each link arm 110 and 112 and the adjacent ends of the piezoceramic wafers 104, 106, produces a low bending stiffness region along the flexure 102 that would otherwise reduce performance of the apparatus 100. The ears 110A and 112A of each link arm 110 and 112, respectively, thus provide increased bending stiffness to offset this.

With further reference to FIG. 5, each of the piezoelectric wafers 104, 106 may vary significantly in thickness, length and width to suit the needs of a particular application. However, in one preferred form, each piezoelectric wafer 104 and 106 has a thickness of about 0.005"-0.02" (0.127 mm-0.508 mm). In one preferred form, the length and width of the piezoelectric wafers 104 and 106 is about 1.8" (45.72 mm) and about 0.6" (15.24 mm) respectively. The actual energy per bending cycle generated by the apparatus 100 is a function of piezoceramic volume that is under stress. A thicker piezoceramic wafer will provide higher energy content, but this energy will be in the form of high voltage and low charge as compared to a thinner material. Although more energy is available from thicker piezoceramic material, the conversion electronics that are needed to capture this energy are significantly more complex and less efficient than that required for use with a thinner piezoceramic wafer. Thinner piezoceramic material produces a lower voltage but much higher charge. Merely as an example, typical capacitance and voltages produced by a piezoceramic wafer, per cycle of oscillation, are as follows:

0.02" thick PZT 5A—10 nF at 200 volts (harder to convert);
0.005" thick PZT 5A—100 nF at 30 volts (easily converted);
Total energy is $(CV^2)/2$ per bending cycle.

Referring to FIG. 6, the oscillating motion of the flexure assembly 102 can be seen in response to a vibration force. The compressive force generated by the biasing elements 114, 116 is sufficient to maintain the flexure assembly 102 in a deflected (i.e., bowed) orientation at one of two stable positions 144 or 146. Longitudinal line 148 represents the plane the flexure assembly 102 would reside in without the compressive force from the biasing elements 114, 116. When in either of positions 144 or 146, the flexure assembly 102 is highly responsive to low frequency vibration energy and is easily deflected to the other stable position by such energy. The spring force provided by the biasing elements can be tailored to provide the required sensitivity for a specific VEH application.

The apparatus thus forms a means to significantly "soften" a piezo flexure which enables the piezo flexure to be used in low frequency vibration energy harvesting applications where such a flexure would otherwise be too structurally stiff to harvest the vibration energy. A significant benefit of the present apparatus is that it can be used over a wider frequency bandwidth than previously developed VEH devices incorporating a tip mass on the free end of the piezo flexure. The capability of operating over a wider bandwidth allows the apparatus 10 to more efficiently harvest vibration energy from the structure and to generate a greater voltage output from the vibration energy than would be possible with a conventional piezo flexure.

Figure 7:
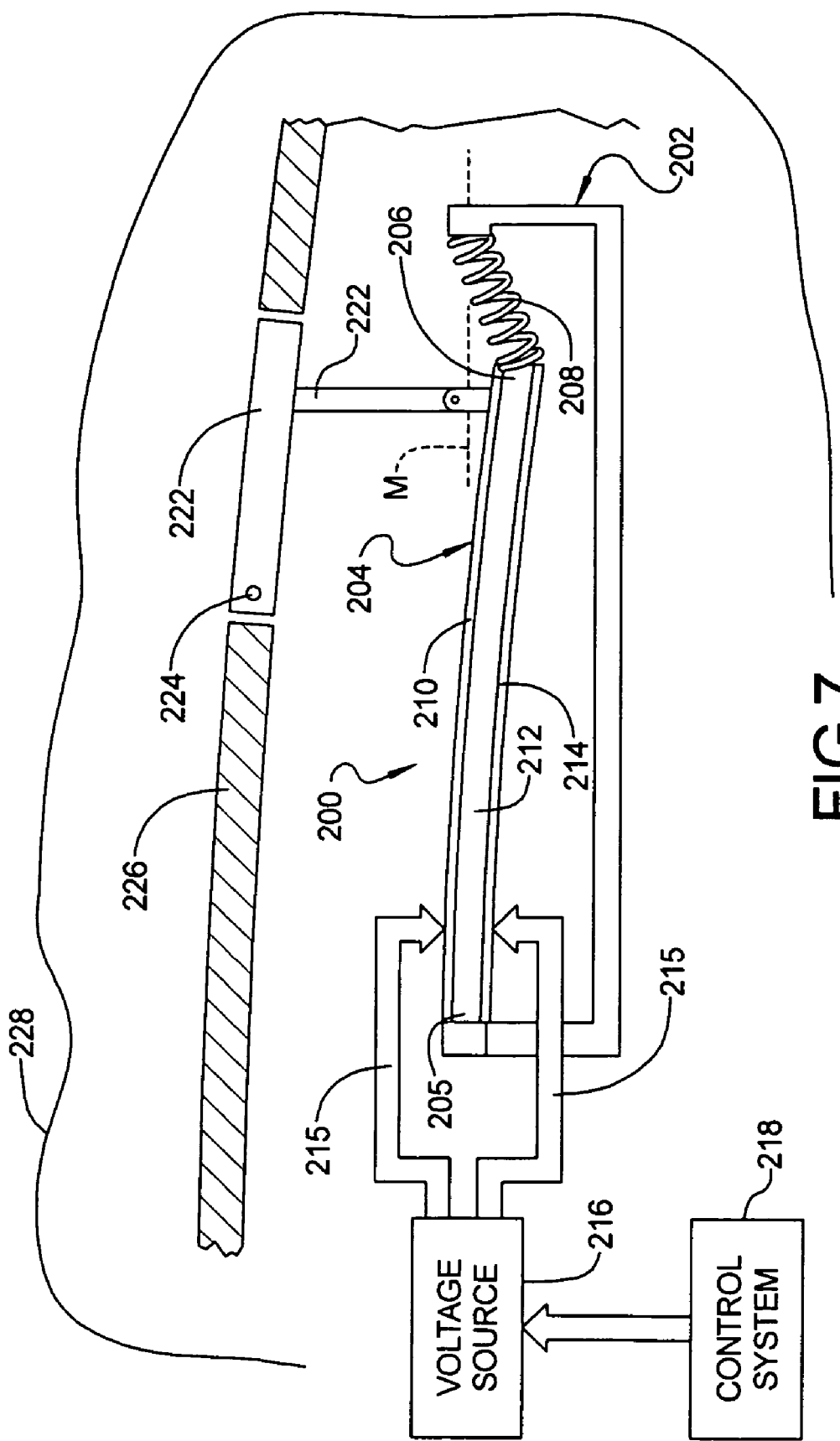
FIG. 7 is a side view of a piezoelectric enhanced-amplitude motor in accordance with an embodiment of the present system showing the beam thereof in a first stable position.
Figure 8:
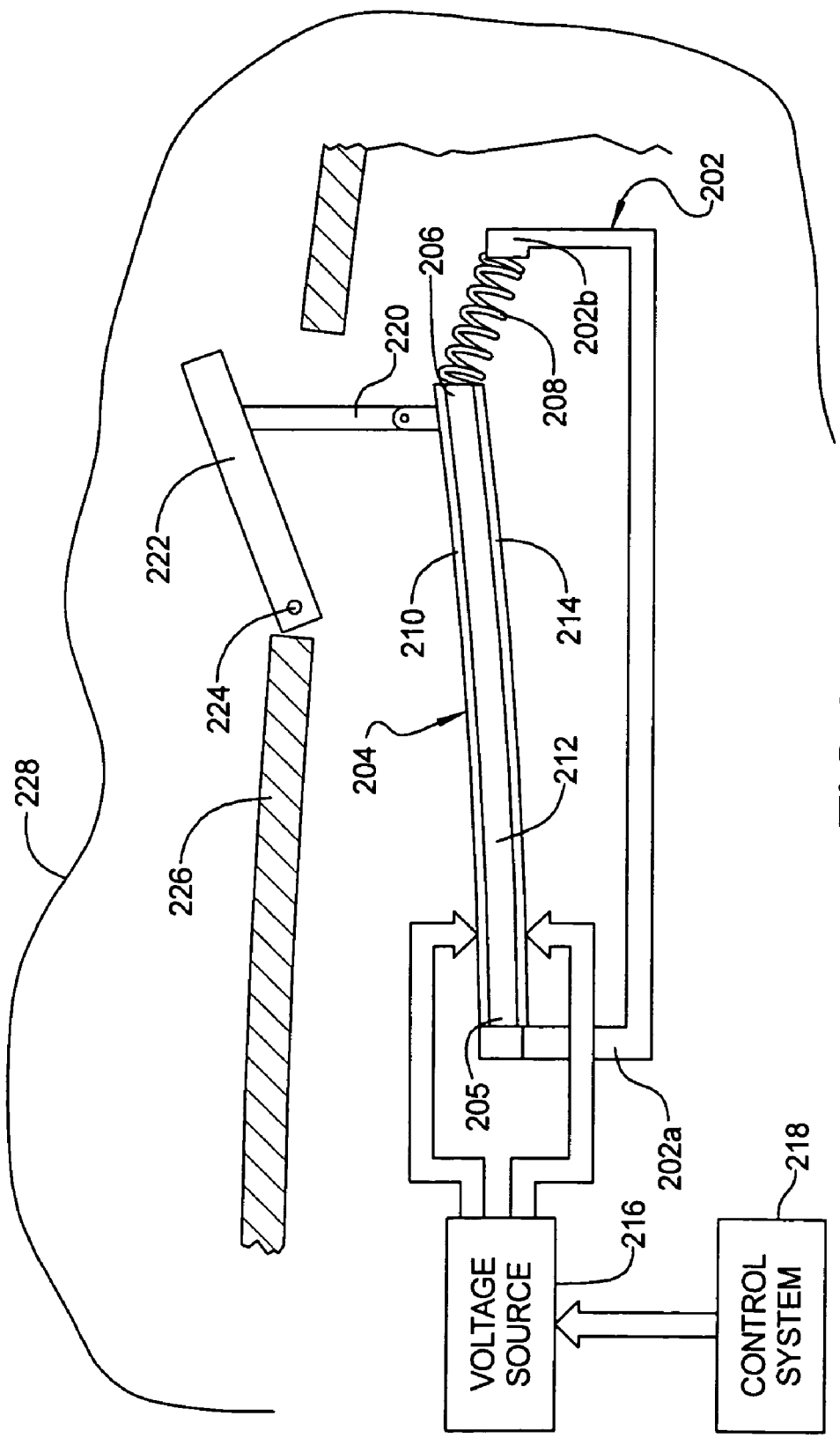
FIG. 8 is a view of the apparatus of FIG. 7 showing the beam deflected into the second stable position.

Referring to FIGS. 7 and 8, a piezoelectric drive motor apparatus 200 is shown in accordance with another embodiment of the present system. The apparatus 200 includes a support structure 202 which is used to support the beam 204 at one end 205. A free end (or tip) 206 of the beam 204 is in contact with a biasing element 208, which in this example is illustrated as a coil spring. However, any suitable biasing member can be used. The biasing element 208 is also supported fixedly or on a hinge from the support structure 202. The beam 204 includes at least one piezoelectric layer 210 which is secured to a surface of a substrate 212. Even more preferably, a second piezoelectric layer 214 is secured to an opposing surface of the substrate 212. Thus, in one form, the beam 204 is formed by substrate 212 with piezoelectric layers 210 and 214 disposed on opposite surfaces of the substrate 212. The substrate 212 itself may be formed from any suitable flexible material, such as plastic, aluminum, steel, titanium, or even composite materials. The support structure 202 may be made from any suitably strong material, for example aluminum, steel or plastic. The piezoelectric layers 210 and 214 each have conductors 215 that are coupled to a suitable voltage source 216, which is in turn in communication with a suitable control system 218. Piezoelectric layers 219 and 214 could just as readily be formed from electrostrictive or magnetostrictive materials. The thickness of each piezoelectric layer is typically in the range of 0.010 inch-0.020 inch (0.254 mm-0.508 mm), although the thickness could vary significantly from this range to suit the needs of a specific application.

The biasing element 208 and the beam 204 are secured to the support structure 202 such that the biasing element 208 can exert a compressive force on the beam 204 with an over-center compressive biasing force. This creates two stable, or extreme, positions for the beam 204, the two positions being on opposite sides of a mid-line "M" extending between the points of attachment of the beam 204 and the biasing element 208 to the support structure 202. The mid-line M can also be viewed as the point of equilibrium of the beam 204 (albeit an unstable one). The biasing element 208 is coupled to the free end 206 of the beam 204 by a flexible coupling, or hinge, or rigid attachment such as a weld or clamp. The end 205 is fixedly coupled to a first upright support 202a of the support structure 202 by adhesives, mechanical coupling via fasteners, or any other secure means of attachment. The biasing element 208 has one end that is fixedly secured to a second upright 202b via any suitable mechanical coupling, hinge, flexure, or by adhesives.

With continuing reference to FIGS. 7 and 8, when a voltage of a first polarity is applied to the piezoelectric layers 210 and 214, they cause the beam 204 to be deflected into a first stable position represented in FIG. 7. The biasing element 208 acting on the free end 206 of the beam 204 significantly amplifies the displacement over what would be achieved without the biasing element 208 acting on the free end 206 of the beam 204. When the polarity of the voltage applied to the piezoelectric layers 210 and 214 is changed, this causes the layers 210 and 214 to deflect the beam 204 into the second stable position shown in FIG. 8. Again, the biasing element 208 assists in driving the beam 204 into the second stable position once the movement of the free end 206 of the beam 204 passes the mid-line M. The biasing element 208 effectively amplifies the displacement of the beam from the mid-line M in both opposing directions to increase the excursion of the free end 206 of the beam 204 from the mid-line M (i.e., the equilibrium point). When an alternating polarity signal is applied to the piezoelectric layers 210 and 214, the beam oscillates between the two stable positions shown in FIGS. 7 and 8. It will be appreciated that the precise point at which the mid-line M is formed can vary. For example, if the load applies a force to the beam 204, the apparatus 200 may be even more effective if the beam 204 is biased slightly toward the load. This would move the location of the mid-line M toward the load as well.

A significant advantage of the apparatus 200 is that the amplitude displacement of the free end 206 of the beam 204 is significantly greater than with previous piezoelectric actuator configurations, and especially so at frequencies below the natural oscillation frequency of the beam 204. This is in large part due to the effective softening of the beam 204 caused by application of the bias force.

In one implementation, the free end 206 of the beam 204 is coupled via a push rod 220 to a flow control element represented by a flap 222. The flap 222 itself is pivotally secured at a pivot point 224 to a suitable support structure of a wing 226 of an aircraft 228. The enhanced amplitude motion of the free end 206 of the beam 204 allows the flap 222 displacement to be significantly increased over what would be possible without the biasing element 208. It will be appreciated that the apparatus 200 could be employed to drive any other form of flow control component, such as a fan, pump, etc., provided a suitable intermediate linkage is coupled to the free end 206 of the beam 204.

Figure 9:
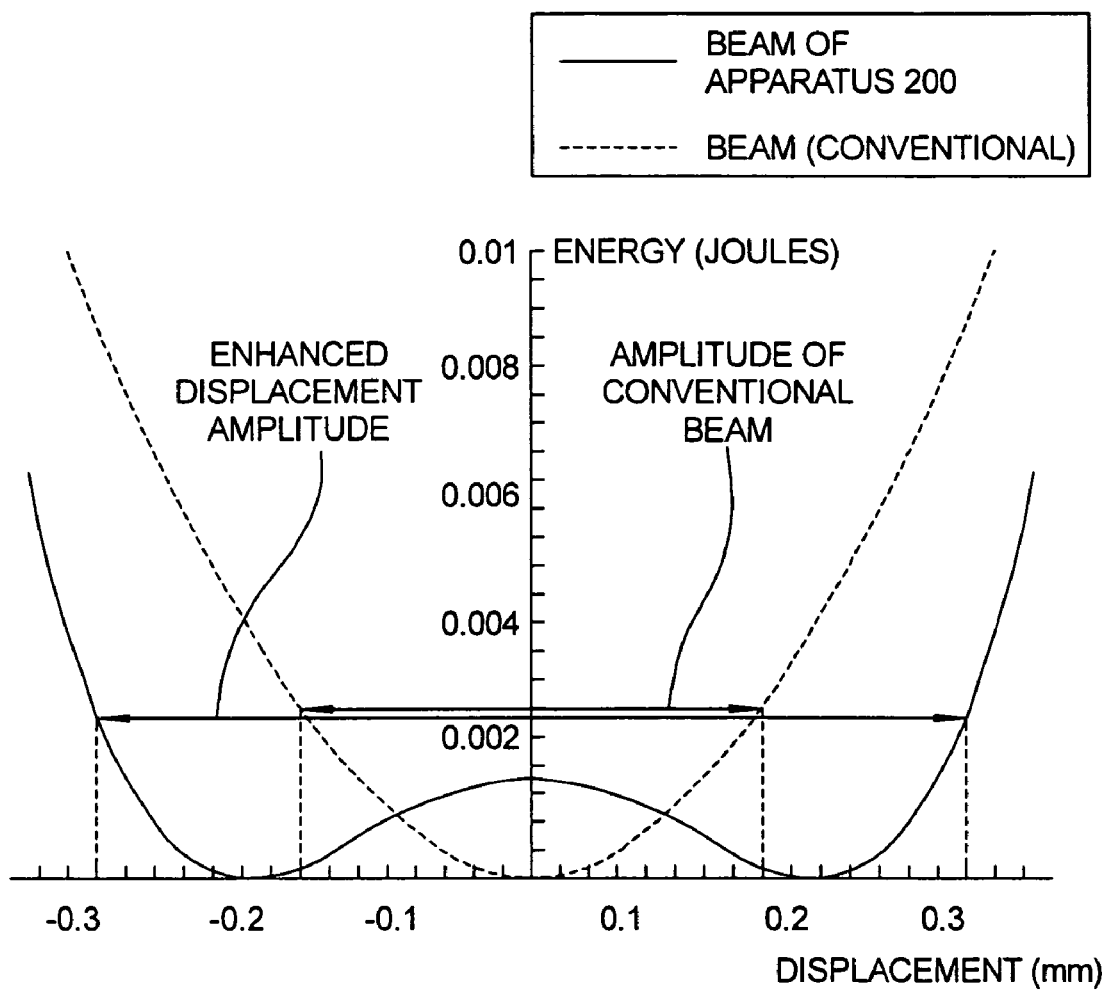
FIG. 9 is a graph showing the amplitude of motion and the potential energy of the apparatus of the present system, compared with a conventional piezoelectric beam without the amplitude-enhancing effect of the biasing element.

Referring to FIG. 9, a graph is shown illustrating the significantly increased amplitude of displacement of the apparatus 200 as compared to an "un-enhanced" beam (i.e., a beam without biasing element 208 at its tip). The apparatus 200 has approximately twice the amplitude displacement of the beam of a conventional piezoelectric beam at an energy of 0.002 Joules. The precise ratio of amplitude enhancement of the apparatus 200 depends on the amplitude of the drive excitation signal and the frequency of the drive signal applied to the piezoelectric layers 210 and 214. The amplitude ratio can be controlled by changing the preload and stiffness of the biasing element 208 relative to the spring constant of the beam 204.

Figure 10:
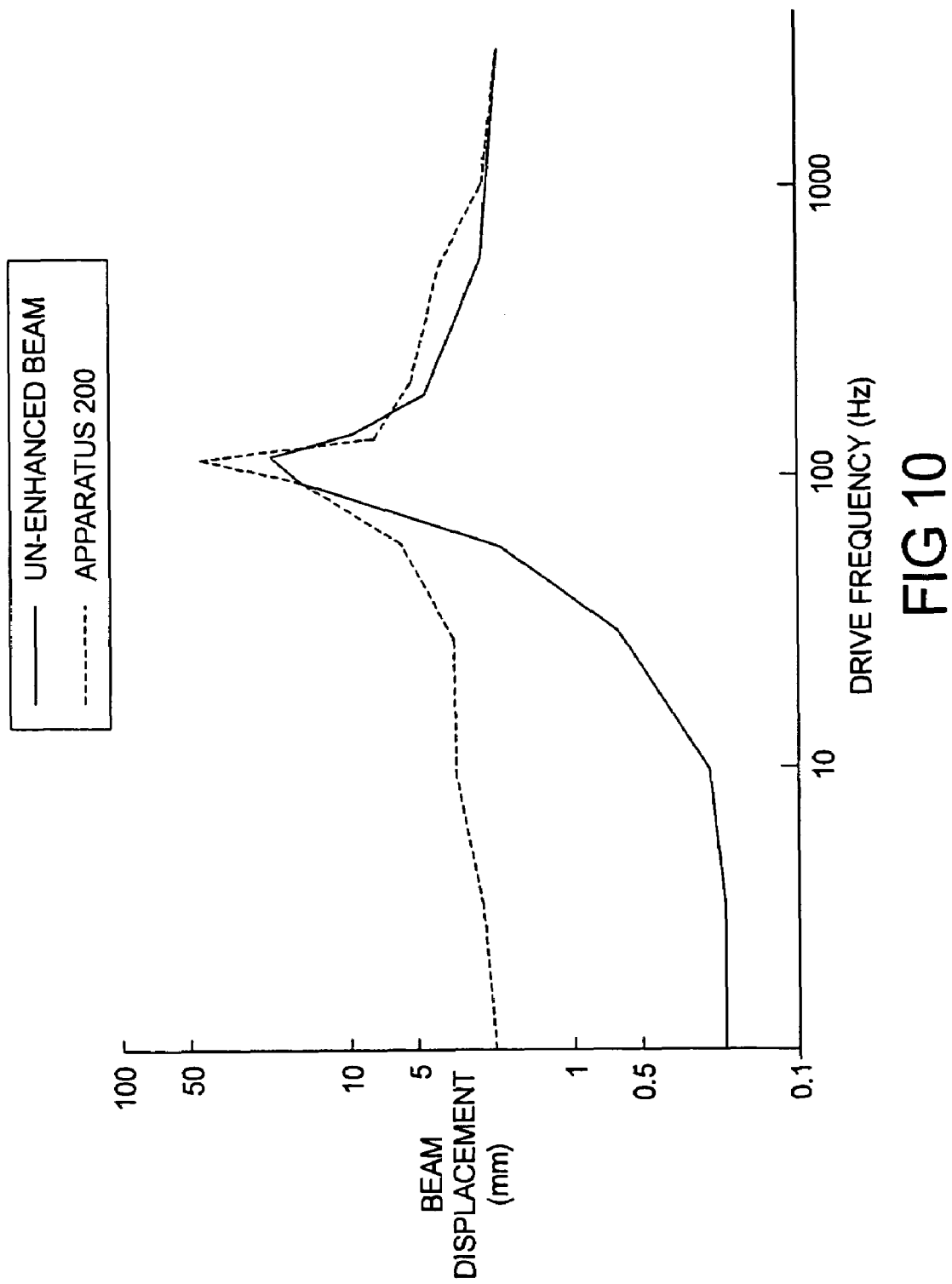
FIG. 10 illustrates a pair of graphs of the beam displacement of the apparatus of the present system, at various frequencies, versus the beam displacement of a conventional piezoelectric beam.

Another important feature of the apparatus 200 is its ability to operate over a wider band of drive frequencies than an "un-enhanced" piezoelectric beam. FIG. 10 illustrates this property. FIG. 10 shows the beam 204 displacement relative to the drive amplitude for the apparatus 200 as compared to an "un-enhanced" piezoelectric drive motor. The apparatus 200 has more than an order-of-magnitude greater amplitude at frequencies below the resonant frequency (i.e., approximately 100 hertz). The increased frequency band is a significant advantage in systems requiring variable frequency drive motors.

Figure 11:
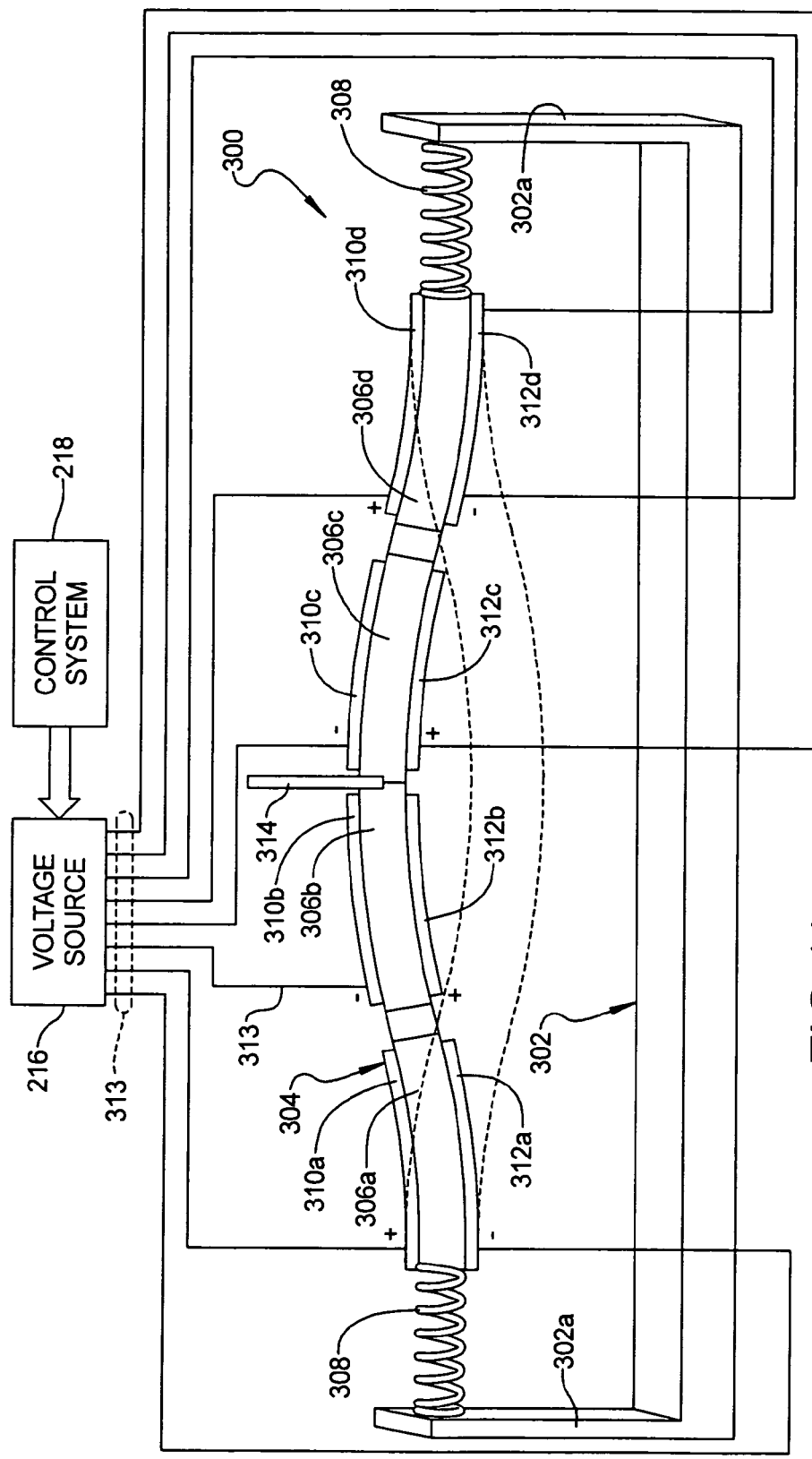
FIG. 11 is a side view of an alternative embodiment of the present system in which a recurve beam is employed and supported by biasing elements at opposing ends.

Referring to FIG. 11, an alternative, full wave drive motor 300 is illustrated. Drive motor 300 includes a support structure 302 and recurve beam 304. The recurve beam 304, in this example, is presented as four substrate portions, 306a, 306b, 306c and 306d, with portions 306a and 306d being supported at their free ends by biasing elements 308. Biasing elements 308 each include one end fixedly secured to associated upright portion 302a of the support structure 302.

Referring further to FIG. 11, substrate 306 includes separate piezoelectric layers 310a, 310b, 310c and 310d on one surface, and preferably a plurality of piezoelectric layers 312a, 312b, 312c and 312d on an opposing surface of the substrate 306. Piezoelectric layers 310a-310d and 312a-312d are coupled via electrical conductors 313 to the voltage source 216. A push rod 314 forms a connecting implement that couples the center substrate section 306b of the beam 304 to an independent flow control element (not shown). The biasing elements 308, which are illustrated as coil springs, exert a compressive force on the beam 304. This increases the amplitude of displacement of the beam 304 when it is moved between its two stable positions, one of which is shown in solid lines and the other being shown in phantom, in FIG. 11. Again, the biasing elements 308 serve to increase the amplitude of displacement of the midpoint of the beam 304 over what would be possible without the biasing elements 308. The substrate sections 306a-306c may be formed from plastic, aluminum, or any other suitable, flexible material. Furthermore, the increased amplitude displacement occurs at frequencies below the resonant frequency of the beam.

Figure 12:
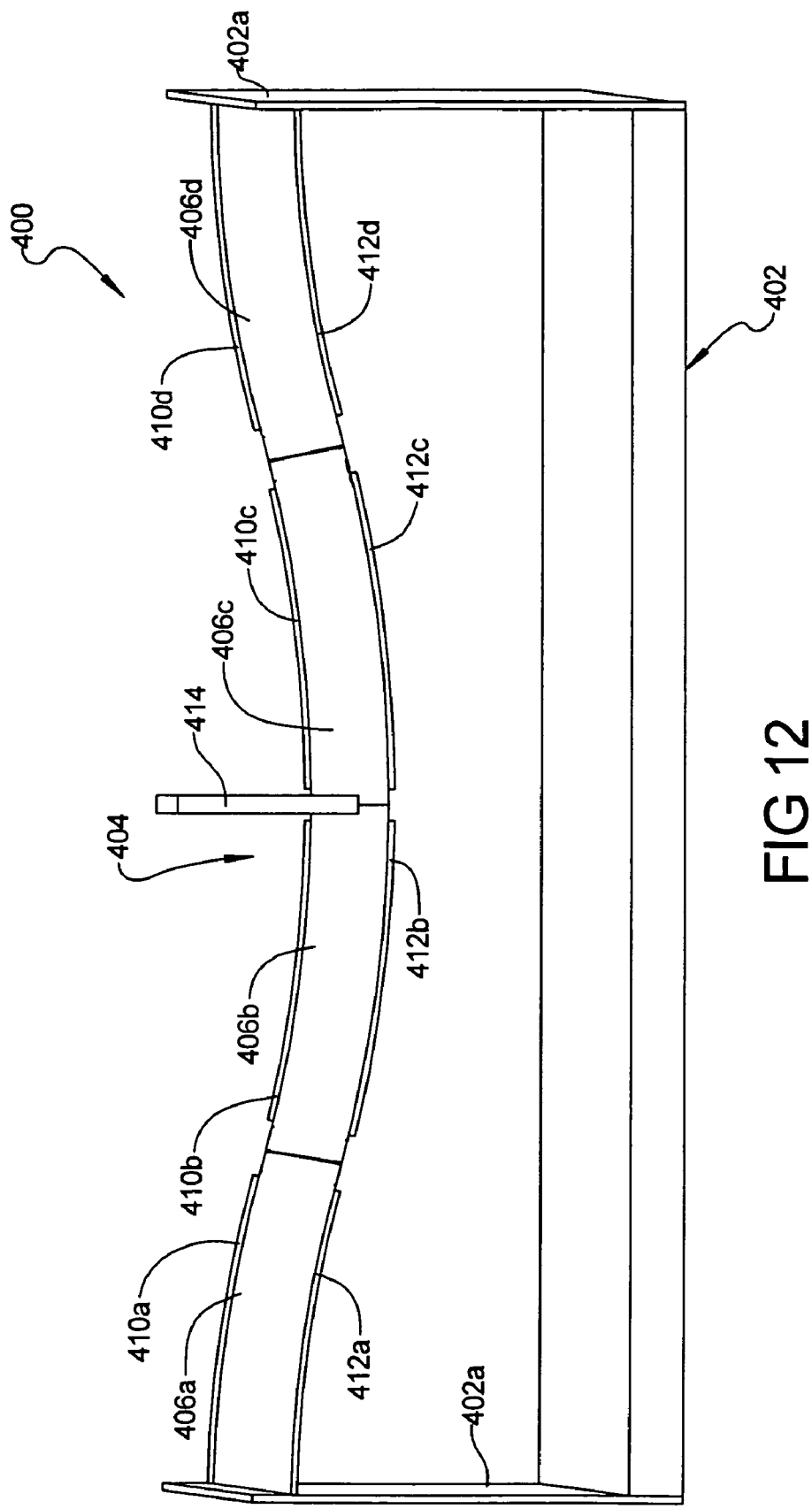
FIG. 12 is another alternative embodiment of the present system in which a recurve beam is employed in connection with a pair of leaf springs acting as the biasing elements on the beam.

Referring to FIG. 12, an apparatus 400 in accordance with an alternative embodiment of a drive motor is illustrated. Apparatus 400 includes a support structure 402 having a pair of leaf springs 402a for providing the compressive force on a recurve beam 404. The beam 404 is otherwise identical in construction with beam 304 described in connection with FIG. 11. Accordingly, reference numerals increased by 100 over those used to describe the beam 304 are used in FIG. 12 to denote the various portions of beam 404. The operation of the apparatus 400 is otherwise identical to that described in connection with FIG. 11.

It will be appreciated that the alternative embodiments of FIGS. 11 and 12 represent only a small plurality of potential configurations to provide the compressive force on the piezoelectric beam 204, 304 or 404. For example, instead of using coil or at leaf springs, a pressure vessel, a pressurized diaphragm, a rubber bumper, a hydraulic piston, or a centripetal force produced by a rotating mass could be employed to provide the compressive force. Still further, a mass under gravity could be employed to exert the compressive force on the piezoelectric beam 204, 304 or 404. Still further, a force developed by flowing air or water could be used to provide the compressive force on the beam 204, 304 or 404. Virtually any form of force that can be controlled such that it applies a compressive force to the piezoelectric beam 204, 304, 404 could be implemented.

The re-curve beams 304 and 404, being "full-wave" beam configurations, are able to provide significantly greater amplitude displacement at the beam center, versus the beam 204, which forms a quarter-wave configuration (i.e., only one length of piezoelectric material is secured on each surface of the beam substrate 206, versus the four independent sections on each surface of beam substrate 306).

The various embodiments of the drive motor described herein provide extremely lightweight mechanisms for implementing active flow control systems. The various embodiments are expected to find utility in commercial and military aircraft, spacecraft, and other applications. Other applications could include use with electronic sights for hand carried weapons, use with control of rotating mechanisms such as latches or levers to open and close doors and latches, use with automatic switches using over-center characteristics to "switch and hold", any 2-state switch, position sensing and switch state sensing applications. Still further uses could be with systems designed for vibration sensing, motion sensing, force sensing, liquid level sensing, etc.

While various preferred embodiments have been described, those skilled in the art will recognize modifications or variations which might be made without departing from the inventive concept. The examples illustrate the present system and method and are not intended to limit it. Therefore, the description and claims should be interpreted liberally with only such limitation as is necessary in view of the pertinent prior art.

What is claimed:

1. An electrically driven actuator apparatus, comprising:
   an electronically responsive piezoelectric wafer;
   a support for supporting said piezoelectric wafer while allowing oscillating motion of a midpoint of said piezoelectric wafer; and
   a biasing element operatively associated with an end of said piezoelectric wafer for applying a compressive pre-load force to said end of said piezoelectric wafer sufficient to deflect said midpoint of said piezoelectric wafer into one of two stable non-linear orientations, and to assist in moving said midpoint between said two stable non-linear positions; and
   said biasing element associated with said end of said piezoelectric wafer being free to flex in an arcuate path in response to vibration experienced by said piezoelectric wafer, to enhance a sensitivity of the piezoelectric wafer and oscillating motion of said midpoint of said piezoelectric wafer in response to said vibration.

2. The apparatus of claim 1, wherein said biasing element comprises a coil spring.

3. The apparatus of claim 1, further comprising:
   a substrate forming a beam, and said piezoelectric wafer being secured to a surface of said substrate, and said biasing element being in abutting contact with said substrate.

4. The apparatus of claim 3, wherein a first end of said beam is secured to said support, and a second end of said beam is disposed against said biasing element, such that said second end is able to oscillate between said two non-linear orientations.

5. The apparatus of claim 3, wherein said beam forms a non-linear shape.

6. The apparatus of claim 5, wherein said beam forms a re-curve shape.

7. A piezoelectric drive motor, comprising:
   a support structure;
   a substrate forming a beam, the beam having a non-linear shape and having opposing ends;
   a first piezoelectric layer secured to a first surface of said beam, the first piezoelectric layer operable to deflect the beam when a voltage is applied to said first piezoelectric layer; and
   first and second biasing elements secured to respective opposing end portions of said substrate and supported from said support structure, said substrate being secured between free ends of said biasing elements so as to be supported by said biasing elements, with said biasing elements exerting a compressive stress on associated free ends of said substrate, said biasing elements each further being able to flex in an arcuate path to and adapted to enhance sensitivity of the first piezoelectric layer to said voltage to assist in causing deflection of a midpoint of said beam between two stable positions.

8. The motor of claim 7, wherein said substrate comprises a plurality of independent sections disposed adjacent one another forming said non-linear shape.

9. The motor of claim 7, wherein said biasing elements comprise leaf springs.

10. The motor of claim 7, further comprising a pair of piezoelectric layers secured to opposing surfaces of said substrate.

* * * * *